United States Patent
Buchanan et al.

(10) Patent No.: US 6,462,393 B2
(45) Date of Patent: Oct. 8, 2002

(54) SCHOTTKY DEVICE

(75) Inventors: Walter R. Buchanan; Roman J. Hamerski, both of Olathe, KS (US)

(73) Assignee: FabTech, Inc., Lee's Summitt, MO (US)

( * ) Notice: Subject to any disclaimer, the term of this patent is extended or adjusted under 35 U.S.C. 154(b) by 0 days.

(21) Appl. No.: 09/812,738

(22) Filed: Mar. 20, 2001

(65) Prior Publication Data

US 2002/0135038 A1 Sep. 26, 2002

(51) Int. Cl.[7] .............................................. H01L 27/095
(52) U.S. Cl. .................... 257/475; 257/476; 257/478; 357/15; 357/22; 357/38; 357/58
(58) Field of Search ............................... 257/476, 478; 357/15, 22, 38, 58; 148/DIG. 88

(56) References Cited

U.S. PATENT DOCUMENTS

| | | | |
|---|---|---|---|
| 4,134,123 A | * | 1/1979 | Shannon .............. 148/DIG. 88 |
| 4,255,757 A | | 3/1981 | Hikin |
| 4,641,174 A | | 2/1987 | Baliga |
| 4,646,115 A | * | 2/1987 | Shannon et al. ............. 257/478 |
| 4,862,229 A | | 8/1989 | Mundy et al. |
| 4,901,120 A | | 2/1990 | Weaver et al. |
| 4,982,246 A | | 1/1991 | Polasko et al. |
| 4,982,260 A | * | 1/1991 | Chang et al. ................ 257/476 |
| 5,017,976 A | | 5/1991 | Sugita |
| 5,060,037 A | | 10/1991 | Rountree |
| 5,081,509 A | | 1/1992 | Kozaka et al. |
| 5,101,244 A | | 3/1992 | Mori et al. |
| 5,138,403 A | | 8/1992 | Spitzer |
| 5,148,241 A | | 9/1992 | Sugita |
| 5,241,195 A | | 8/1993 | Tu et al. |
| 5,262,669 A | | 11/1993 | Wakatabe et al. |
| 5,275,689 A | | 1/1994 | Felten et al. |
| 5,278,443 A | | 1/1994 | Mori et al. |
| 5,291,051 A | | 3/1994 | Hoang et al. |
| 5,345,100 A | | 9/1994 | Kan et al. |
| 5,365,102 A | | 11/1994 | Mehrotra et al. |
| 5,371,400 A | | 12/1994 | Sakurai |
| 5,430,311 A | | 7/1995 | Murakami et al. |
| 5,536,958 A | | 7/1996 | Shen et al. |
| 5,561,313 A | | 10/1996 | Saitoh et al. |
| 5,612,567 A | | 3/1997 | Baliga |
| 5,626,668 A | | 5/1997 | Gerhardinger et al. |
| 5,640,043 A | | 6/1997 | Eng et al. |
| 5,691,554 A | | 11/1997 | Matthews |
| 5,850,095 A | | 12/1998 | Chen et al. |
| 5,914,500 A | | 6/1999 | Bakowski et al. |
| 5,923,079 A | | 7/1999 | Narita |
| 5,929,690 A | | 7/1999 | Williams |
| 5,930,660 A | | 7/1999 | Davis |
| 6,011,280 A | | 1/2000 | Fruth et al. |
| 6,162,665 A | | 12/2000 | Zommer |
| H40 H | | 4/1986 | Buchanan, Jr. et al. |

FOREIGN PATENT DOCUMENTS

| | | |
|---|---|---|
| DE | 19824514 | 3/1998 |
| DE | 19723176 | 8/1998 |
| EP | 0372428 | 6/1990 |
| JP | 04-233281 | 8/1992 |
| JP | 05-326925 | 10/1993 |
| JP | 10-116999 | 6/1998 |

* cited by examiner

*Primary Examiner*—David Nelms
*Assistant Examiner*—Mai-Huong Tran
(74) *Attorney, Agent, or Firm*—Blackwell, Sanders, Peper, Martin, LLC

(57) ABSTRACT

An improved Schottky device, having a low resistivity layer of semiconductor material, a high resistivity layer of semiconductor material and a buried dopant region positioned in the high resistivity layer utilized to reduce reverse leakage current. The low resistivity layer can be an $N^+$ material while the high resistivity layer can be an $N^-$ layer. The buried dopant region can be of $P^+$ material, thus forming a PN junction with an associated charge depletion zone in the $N^-$ layer and an associated low reverse leakage current. The location of the $P^+$ material allows for a full Schottky barrier between the $N^-$ material and a barrier metal to be maintained, thus the device experiences a low forward voltage drop.

28 Claims, 2 Drawing Sheets

SCHOTTKY DEVICE

COPYRIGHT NOTICE AND AUTHORIZATION

A portion of the disclosure of this patent document contains material, which is subject to mask work protection. The mask work owner has no objection to the facsimile reproduction by anyone of the patent document or the patent disclosure, as it appears in the Patent and Trademark Office patent file or records, but otherwise reserves all mask work rights whatsoever.

FIELD OF THE INVENTION

This invention relates to semiconductor devices and methods of manufacturing semiconductor devices, and more particularly, to semiconductor devices and methods of manufacture utilizing charge depletion regions to enhance Schottky diode behavior.

BACKGROUND OF THE INVENTION

Schottky semiconductor devices traditionally include an $N^+$ low resistivity substrate, an $N^-$ high resistivity epitaxial layer adjacent to the $N^+$ substrate, and a barrier metal adjacent to the $N^-$ layer, wherein a Schottky barrier or Schottky junction is formed between the $N^-$ layer and the barrier metal. Schottky diodes also typically include a guard ring adjacent to the perimeter of the barrier metal and located in the $N^-$ layer. Traditional Schottky semiconductor devices experience a desirable low forward voltage drop and an undesirable high reverse leakage current. In other words, the voltage drop across the Schottky diode during the current transmission period of the diode's operation is desirably low, but, during the time when the diode is not expected to conduct current, the Schottky diode can experience a conduction of current. The nature of a standard Schottky barrier device is such that when the Schottky barrier height between the $N^-$ layer and the barrier metal is large, the reverse current is small. Conversely, when the Schottky barrier height is small, the reverse leakage current is large. Normal current flow is in the direction of the anode to the cathode, in other words, from the barrier metal to the semiconductor. This current flow is primarily from electrons flowing from the semiconductor into the metal. Also, in regards to a traditional Schottky device, with increased temperature, leakage current increases exponentially. Thus, temperature operating ranges are restricted to strictly defined temperature ranges.

PN diodes, which include an N layer adjacent to a P layer, have the following benefits and disadvantages. In a forward current flow, from the P layer to the N layer, current flows through the PN diode after a minimum voltage is reached. This voltage can be, for example, 0.7 volts. The voltage drop will continue to increase as the forward current increases. Traditional PN semiconductor devices experience this high forward voltage drop and a lower reverse leakage current. In other words, the voltage drop across the PN diode during the current transmission period of the diode's operation is undesirably high, but, during the time when the diode is not expected to conduct current, the PN diode experiences a very low conduction of current compared to a Schottky device. In a reverse current flow, the PN diode appears as a high resistance to the flow and, thus, only a small amount of reverse current flows through the diode. Also, the maximum operating temperature rating is usually higher for a PN diode than for a Schottky diode. Thus, each type of device has characteristics that make it preferable for different applications.

To remedy large reverse leakage current in semiconductor devices, designers produced a hybrid of PN devices and Schottky devices. These hybrids consist of devices with areas of $P^+$ material adjoining barrier metal. By this addition of $P^+$ material in contact with the barrier metal of a Schottky device, designers have experienced some benefits by seeing a reduction in the reverse leakage current, but have also sacrificed desirable characteristics by significantly consuming the Schottky barrier area by $P^+$ doped regions, thus not creating an ideal tradeoff between a desired low forward voltage drop and a desired low reverse leakage current.

BRIEF SUMMARY OF THE INVENTION

There is, therefore, provided in the practice of the invention a novel semiconductor device, which provides for an improved low forward voltage drop and a low reverse leakage current. The semiconductor device broadly includes a first layer of semiconductor material of a first conductivity type. A region of semiconductor material of a region conductivity type is positioned such that the first layer of semiconductor material surrounds the region. A second layer of semiconductor material of a second conductivity type is adjacent to, contiguous with, the first layer.

In a preferred embodiment, the region conductivity type is P type and the first and the second conductivity types are N type. Preferably, a conductor is in contact with the second side of the second layer of semiconductor material and a barrier metal is adjacent to the second side of the first layer of semiconductor material.

It is further contemplated in the practice of a preferred embodiment of the invention that the Schottky barrier area be relatively free from semiconductor material of P type, with the exception in an embodiment that a guard ring area can be in contact with the P type material of the region of semiconductor material.

An object of the present invention is to provide an improved Schottky device without diminishing the area of the Schottky barrier and retaining the benefits of a PN diode. The present invention has an improved high temperature performance with a low reverse leakage current and a low forward voltage drop.

BRIEF DESCRIPTION OF THE DRAWINGS

These and other inventive features, advantages, and objects will appear from the following Detailed Description when considered in connection with the accompanying drawings in which similar reference characters denote similar elements throughout the several views and wherein.

DETAILED DESCRIPTION

Figure 1:
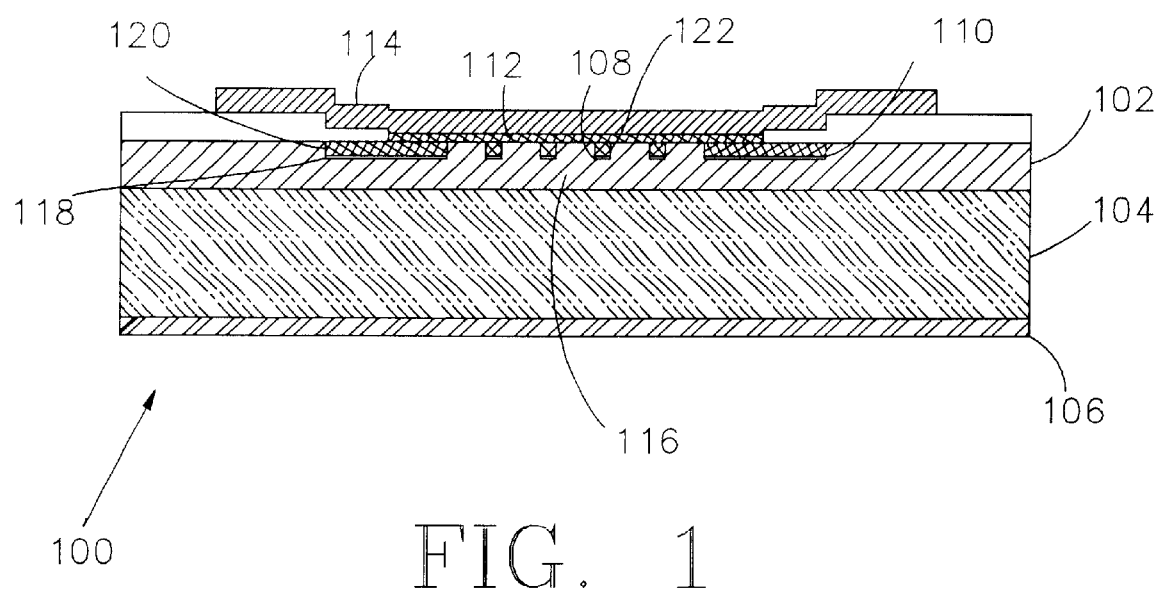
FIG. 1 is an enlarged, cross-sectional view of a diode having improved characteristics according to the present invention.

Referring to the drawings in greater detail, FIG. 1 shows an improved semiconductor device 100 constructed in accordance with a preferred embodiment of the present invention. The semiconductor device 100 broadly includes a first layer of semiconductor material 102, a second layer of semiconductor material 104, a region of semiconductor material 108 of a region conductivity type positioned in the first layer of semiconductor material 102, a guard ring 110, a barrier metal 112, a conductor 106, and a back metal 114. Placement of the region of semiconductor material is positioned such that the first layer of semiconductor material surrounds the region providing for a charge depletion zone of a PN junction to offer benefits of low reverse leakage current and for a Schottky barrier 116 relatively free from P material so as to offer a low forward voltage drop.

A diode allows for general current flow in one direction through the diode. This direction is from the anode to the cathode. This allows for current to be passed during the time that the voltage across the diode is positive. One of the test results for the semiconductor device 100 depicts that a forward voltage drop at a current density of 157 amperes/cm$^2$ does not exceed approximately 305 millivolts and the reverse leakage current does not exceed approximately 180 microamperes at 30 volts reverse bias.

In a preferred embodiment, the first layer 102 includes a high resistivity semiconductor material. The first layer 102 can be an epitaxial layer formed by a deposition of N$^-$ type material on the second layer of the semiconductor material 104. In this embodiment, the second layer 104 is formed of a low resistivity semiconductor material. The second layer of semiconductor material 104 can be a single crystal silicon substrate of an N$^+$ type material. Thus, the first layer 102 and the second layer 104 can be the same conductivity type with differences in dopant concentration, in that the first layer 102 has a lower dopant concentration than the second layer 104. In an alternate embodiment, the second layer 104 can be formed by a diffusion process.

The region of semiconductor material 108 of the region conductivity type provides for the charge depletion zone within the first layer 102. The region 108 can be of a P$^+$ conductivity type. The region 108 is buried in the first layer 102, such that the first layer of semiconductor material 102 surrounds the region 108. Thus, a layer of the device 100 includes the region 108 and a volume encapsulating the region 108. Although the dopant region 108, which can be an embedded boron region, may add an increase in series resistance to the diode, this series resistance is compensated for by the N type dopant portion 122 of semiconductor material of the first layer 102 lying between the region 108 and the barrier metal 112. The guard ring 110 can be formed of the region conductivity type and incorporated within the first layer 102. As shown in FIG. 1, the guard ring 110 can be part of the first layer 102.

Figure 2:
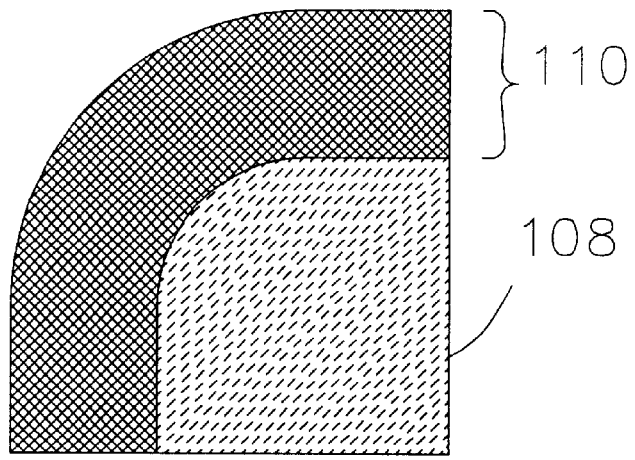
FIG. 2 is an enlarged schematic top view of the diode of FIG. 1 illustrating a dopant region configuration according to the present invention.

FIG. 2 shows a preferred embodiment of the placement of plurality of regions 108. The regions 108 in this embodiment are dots in a hexagonal configuration. The dots can be, for example, 0.3 μm thick with a diameter of 1.0 μm and center-to-center spacing of 2.6 μm. The guard ring 110 can be placed at the perimeter of the plurality of regions. The guard ring 110 is formed thicker than the dots. The outside perimeter of the region 108 can be substantially circular. The region 108 can be of a variety of shapes, such as just one dot or a solid. However, the use of isolated dots minimizes the pathway restricted by the presence of the dots.

Figure 3:
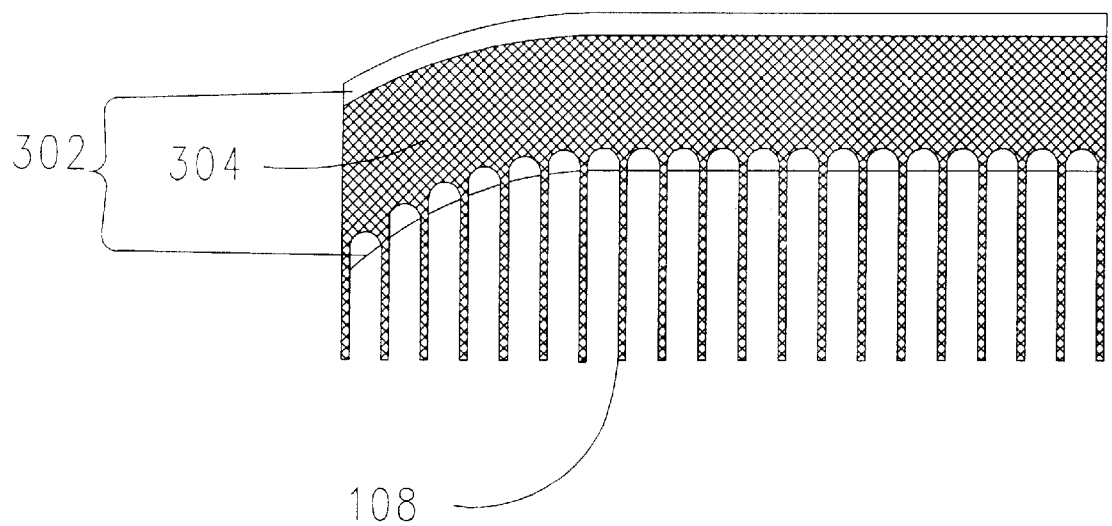
FIG. 3 is an enlarged schematic view of a diode illustrating an alternative dopant region configuration according to the present invention.

FIG. 3 shows an alternative preferred embodiment to the placement of a plurality of regions 108 by viewing the placement from the opposite side of the Schottky barrier metal 112. The regions 108 in this configuration form a series of stripes. Spacing between the regions can vary. The stripes can be, for example, 0.3 μm thick. The regions 108 can be of a variety of shapes including just one stripe or a solid. The region 108 can have opposed first and second sides. The region 108 can include an elongated region. Each region 108 can have opposing sides. Each region 108 can be spaced from one another. A widened guard ring 302 is formed incorporated within the first layer 102 and wider than the area 304 formed with the plurality of regions 108. Note the difference between the guard ring 110 of FIG. 1 and FIG. 2 and the widened guard ring 302 of FIG. 3. The guard rings 110 of FIG. 1 and FIG. 2 have approximately the same perimeter as portion 118 corresponding to a first application of P type conductivity in the guard ring area. FIG. 3 depicts the widened guard ring 302 as extending beyond the area 304 of the region 108. Therefore, the guard ring can be created wider than or equal to the perimeter of the regions.

Referring back to FIG. 1, the barrier metal 112 is adjacent to the first layer 102. A preferred barrier metal 112 is titanium silicide. As the present invention operates over a broader temperature range, a lower Schottky barrier 116 than for a traditional Schottky device can be used, thus promoting a lower forward voltage drop. This lower Schottky barrier 116 height allows for a smaller size of semiconductor chip to be created and results in a higher yield.

The back metal 114 is deposited adjacent to the barrier metal 112. The back metal 114 can be formed of a layering of titanium, nickel, and gold.

A preferred method of fabricating the semiconductor device 100 will now be explained. The process is begun with a substrate of a first conductivity type. The substrate can be an arsenic doped single crystal silicon substrate of N conductivity type. The substrate can be a low resistivity N$^+$ layer of semiconductor material of resistivity less than 0.005 Ωm.

An epitaxial layer of the first conductivity type is formed on the substrate. The conductivity type can be N type. The epitaxial layer can be a high resistivity N$^-$ layer. An oxide layer of approximately 1 μm thick is then formed on the epitaxial layer. Thermal oxidation is a preferred method for producing the oxide layer. After the oxide layer is formed a preferred process utilizes photolithography to transfer a design pattern onto the oxide layer according to the pattern detail. Refer to FIGS. 2 and 3 for examples of pattern details. The oxide is etched by using a Reactive Ion Etching (RIE) according to the pattern detail. This forms openings in the oxide layer. The openings in the oxide layer correspond to and are configured to provide a desired dopant region pattern. This process can be referred to as an oxide pattern etch. Photoresist can be left on top of the oxide if thin oxide has been formed.

At this point, the region 108 of semiconductor material, or first type of dopant, is embedded into the high resistivity layer such that the high resistivity layer completely surrounds the first type of dopant, the first type of dopant being embedded in the layer through the pattern of openings defined by the above described etching process. Thus the pattern opening defines a predetermined location for embedding the dopant. The predetermined location is determined by the product designer at design time. The dopant region is positioned in the high resistivity layer and spaced from the high resistivity layer surface that is adjacent to the barrier metal. The dopant region may be spaced closer to this high resistivity layer surface than to the opposing surface of the high resistivity layer. The first type of dopant can be introduced using one of several different methods. Several of the methods are listed, although it will be apparent to one skilled in the art that these methods are examples and there are other methods of obtaining the same results. Also, one skilled in the art will recognize that the device could be of other semiconductor materials than those listed. For example, covered designs could include a dopant type inverted structure, such that buried areas of the device could be N type, while the Schottky barrier 116 could be formed between the barrier metal 112 and P type semiconductor material.

One method of embedding the first type of dopant is through ion implantation. A first type of dopant, for example boron to produce P type conductivity, is implanted, using the oxide as a masking shield. For example, the boron can be implanted using a dose of $1E13/cm^2$ at an energy of 140 keV. The implantation of boron may leave tails in the high resistivity layer. A second type of dopant can be introduced into the high resistivity layer at substantially the same predetermined location as for the introduction of the first type of dopant. The second type of dopant can be phosphorous to produce N type conductivity. By implanting the second type of dopant, remnants of the implant of the first type of dopant, such as tails of the first type of dopant remaining after the ion implantation, are flattened, assuring that no P region contacts the surface of the high resistivity layer, except in the area of the guard ring 110. This process leaves a more concise form of the first type of dopant in the high resistivity layer of semiconductor material, assuring that the first type of dopant is embedded. The introduction of the second type of dopant can be through ion implantation of phosphorous using a dose of $8E11/cm^2$ at an energy of 100 keV. The phosphorous doping is adjusted so that the second type of dopant portion 122 between the boron dopant region and the surface of the high resistivity layer will be of the same conductivity type and approximate dopant level as the high resistivity layer. If the first type of dopant does not extend to the Schottky barrier 116 due to the relatively high energy of the ions, the implant of the second type of dopant might be avoided.

Through this deep ion implantation of acceptors ($P^+$ region) followed by a shallower implantation of donors (N type conductivity) the effective Schottky barrier 116 is preserved. The embedded $P^+$ regions effectively suppress the leakage current as soon as the depletion layer of the Schottky barrier 116 under reverse bias reaches the embedded regions.

Another method for forming a region 108 in the high resistivity layer 102 is to use $P^+$ diffusion in the area of the region and subsequent N type epitaxial deposition. Yet another method of forming a region 108 is to use a heavily doped $P^+$ epitaxial layer, pattern etch the epitaxial layer, and subsequently deposit an N type epitaxial layer. All of these methods result in a Schottky diode enhanced by an array of buried $P^+$ areas serving to suppress the reverse leakage current.

The guard ring 110 is now formed. Regions 108 have been positioned such that the first layer of semiconductor material surrounds the regions 108 including the first P type implant area portion 118, corresponding to the first application of P type conductivity in the guard ring vicinity. A second photolithography step is applied to provide for only the $P^+$ guard ring to be available for another application of $P^+$ dopant in the depicted application area 120. The additional P type implant might be applied directly after photoresist development. If it is desired that the widened guard ring 302 be as shown in FIG. 3, an oxide etch can be performed before the $P^+$ dopant is applied. One method for applying the guard ring 110 or the widened guard ring 302 is to use ion implantation of boron with an example dose of $1E14/cm^2$ at an energy of 30 keV. The photoresist is removed after this step. Hence, the guard ring can be formed through a process of embedding a P type dopant, then an N type dopant, and then a P type dopant.

Activation/annealing is then performed in an oxidizing atmosphere. Annealing restores the structure and activates the dopant. This grows a thin oxide in previously implanted windows. Once activation/annealing is completed, a contact photolithography step is then performed. The oxide is etched from the area intended for barrier metal. The photoresist is then removed. Next, barrier metal is deposited. The barrier metal can be one requiring silicide formation, such as titanium silicide. The excess titanium is then etched away and subsequent layers of metal are deposited. This forms the back metal.

Thus, an improved Schottky device is disclosed which utilizes buried semiconductor regions to add charge depletion zones thereby reducing reverse leakage current. While preferred embodiments and particular applications of this invention have been shown and described, it is apparent to those skilled in the art that many other modifications and applications of this invention are possible without departing from the inventive concepts herein. For example, using barrier materials not requiring silicide formation, such as molybdenum. Also, it is recognized that the steps above, set forth in a sequencing pattern, can be interchanged, added to, or skipped. It is, therefore, to be understood that, within the scope of the appended claims, this invention may be practiced otherwise than as specifically described, and the invention is not to be restricted except in the spirit of the appended claims. Though some of the features of the invention may be claimed in dependency, each feature has merit if used independently.

What is claimed is:

1. A semiconductor device having improved forward voltage drop and reverse leakage current characteristics, the device comprising:
   a low resistivity layer of semiconductor material having a first conductivity type and having first and second low resistivity layer surfaces;
   a high resistivity layer of semiconductor material having the first conductivity type and having first and second high resistivity layer surfaces, the first high resistivity layer surface being contiguous with the first low resistivity surface;
   a dopant region buried in the high resistivity layer; and
   a barrier metal formed on the second high resistivity layer surface.

2. The semiconductor device as claimed in claim 1 wherein the high resistivity layer is an epitaxial layer.

3. The semiconductor device as claimed in claim 1 wherein the low resistivity layer is formed by a diffusion process.

4. The semiconductor device as claimed in claim 1 wherein the dopant region is spaced closer to the second high resistivity layer surface.

5. The semiconductor device as claimed in claim 1 wherein the dopant region includes at least one dot.

6. The semiconductor device as claimed in claim 1 wherein the dopant region includes at least one stripe.

7. The semiconductor device as claimed in claim 1 wherein the dopant region is a solid region.

8. The semiconductor device as claimed in claim 1 wherein the dopant region includes a second conductivity type.

9. The semiconductor device as claimed in claim 8 wherein the second conductivity type is a P conductivity type.

10. The semiconductor device as claimed in claim 1, further comprising a second type of dopant portion between the dopant region and the second surface of the high resistivity layer.

11. The semiconductor device as claimed in claim 10 wherein the second type of dopant portion will be of the first conductivity type and approximate dopant level as the high resistivity layer.

12. The semiconductor device as claimed in claim 1 wherein the dopant region is implanted through ion implantation.

13. The semiconductor device as claimed in claim 1 further including a guard ring adjacent to the barrier metal.

14. The semiconductor device as claimed in claim 13 wherein the guard ring is further incorporated within the high resistivity layer.

15. The semiconductor device as claimed in claim 13 wherein the guard ring includes P conductivity type.

16. The semiconductor device as claimed in claim 13 wherein the guard ring includes P and N conductivity types.

17. A layer of a Schottky device, the layer comprising:

a region of a first conductivity type; and a volume of a second conductivity type encapsulating the region.

18. The layer according to claim 17 wherein the region is primarily boron.

19. The layer according to claim 17 wherein an outside perimeter of the region is substantially circular.

20. The layer according to claim 17 wherein the region has opposed first and second sides.

21. The layer according to claim 17 wherein the region includes an elongated region.

22. The layer according to claim 17 further comprising a plurality of regions each of the regions including opposing sides.

23. The layer according to claim 22 wherein each of the regions is spaced from one another.

24. A semiconductor device comprising:

a first layer of semiconductor material of a first conductivity type, the first layer of semiconductor material having a first side and a second side;

a region of semiconductor material of a region conductivity type, positioned such that the first layer of semiconductor material surrounds the region of semiconductor material; and a second layer of semiconductor material of a second conductivity type, the second layer of semiconductor material having opposing first and second sides, wherein the first opposing side is adjacent to the first side of the first layer of semiconductor material.

25. The semiconductor device as claimed in claim 24 wherein the region conductivity type is P type.

26. The semiconductor device as claimed in claim 24 wherein the first conductivity type and the second conductivity type are N type.

27. The semiconductor device as claimed in claim 24 further including a conductor in physical contact with the second side of the second layer of semiconductor material; and a barrier metal adjacent to the second side of the first layer of semiconductor material and forming a Schottky junction with the first layer of semiconductor material.

28. The semiconductor device as claimed in claim 27 in which the forward voltage drop at a current density of 157 amperes/cm$^2$ does not exceed approximately 305 millivolts and the reverse leakage current does not exceed approximately 180 microamperes at 30 volts reverse bias.

* * * * *